United States Patent [19]

Albean

[11] Patent Number: 4,691,234
[45] Date of Patent: Sep. 1, 1987

[54] NOISE REDUCTION CIRCUIT FOR TELEVISION MULTI-CHANNEL SOUND

[75] Inventor: David L. Albean, Indianapolis, Ind.
[73] Assignee: RCA Corporation, Princeton, N.J.
[21] Appl. No.: 761,216
[22] Filed: Jul. 31, 1985
[51] Int. Cl.[4] .............................................. H04N 7/04
[52] U.S. Cl. .................................... 358/144; 358/198
[58] Field of Search ................ 358/144, 198; 381/1-4, 381/7

[56] References Cited

PUBLICATIONS

"The DBX Television Multichannel Sound Compander: Characterization" by L. B. Tyler, published by Electronic Industries Association, 12/83, pp. 22-56.
"TV Multichannel Sound—The BTSC System" by C. G. Eilers, IEEE Transactions on Consumer Electronics, 2/85, vol. CE-31, No. 1, pp. 1-7.
"A Companding System for Multichannel TV Sound" by Tyler et al., IEEE Transactions on Consumer Electronics, 11/84, vol. CE-30, No. 4, pp. 633-640.
"Handbook of Industrial Electronic Circuits", Markus et al., published by McGraw-Hill Book Company, Inc., New York, 1948, pp. 5-9.
"TV Multichannel Sound—The BTSC System" by C. G. Eilers, IEEE Transactions on Consumer Electronics, 8/84, vol. CE-30, No. 3, pp. 236-241.
"TV Multichannel Sound—Encoding and Transmission" by Lee et al., IEEE Transactions on Consumer Electronics, 8/84, vol. CE-30, No. 3, pp. 242-246.
"TV Multichannel Sound—Reception and Decoding" by Mycynek et al., IEEE Transactions on Consumer Electronics, 8/84, vol. CE-30, No. 3, pp. 247-250.

*Primary Examiner*—Tommy P. Chin
*Assistant Examiner*—David E. Harvey
*Attorney, Agent, or Firm*—P. J. Rasmussen; P. M. Emanuel; R. H. Kurdyla

[57] ABSTRACT

A television receiver includes an audio signal processing arrangement for expanding a second audio program (SAP) signal compressed in accordance with the "dbx" system in a relatively simple manner. The signal processing arrangement includes a first filter for providing a first amount of deemphasis. A controllable gain amplifier has its input coupled to the filter and its gain controlled by a filtered signal representative of its input signal. A second filter at the amplifier output provides a second amount of deemphasis.

5 Claims, 1 Drawing Figure

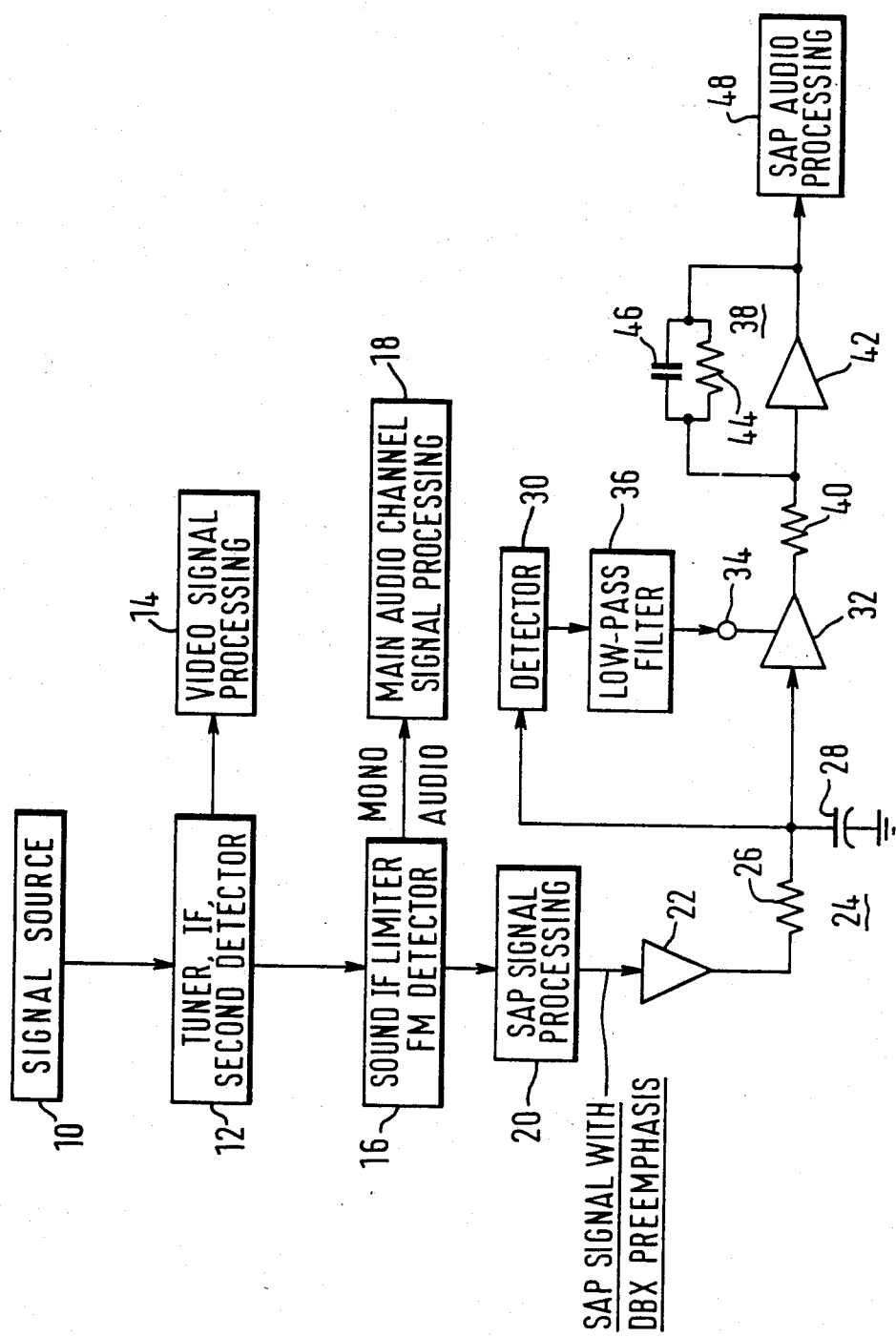

NOISE REDUCTION CIRCUIT FOR TELEVISION MULTI-CHANNEL SOUND

The present invention relates to the field of multi-channel sound reception, such as may be employed in providing stereophonic (stereo) sound and a second audio program (SAP) in a television (TV) receiver.

The broadcasting of multichannel or stereo sound programs for TV in the United States is in accordance with the system adopted by the Broadcast Television Systems Committee of the Electronics Industries Association. This television multichannel sound system provides for the transmission of the sum of left and right stereo audio information (L+R) in a main audio channel in the spectrum space of the television signal presently occupied by the monophonic (mono) audio signal. A difference of left and right stereo audio information (L−R) is modulated onto a subcarrier and transmitted in a subchannel.

The television multichannel system also provides for the option of simultaneously transmitting a second audio program (SAP) channel which may typically carry a second language version of the program being provided in the main (L+R) audio channel. The audio frequency response of the SAP channel is in the range of 50 Hz to 10 kHz, which is relatively restricted as compared with the 50 Hz to 15 kHz for the main channel and the (L−R) subchannel. This bandwidth has been deemed to be sufficient for the nature of the bulk of program material expected to be carried on the SAP channel.

The stereo subchannel and the SAP channel both use subcarriers at frequencies above the audio range and, due to the nature of the frequency modulation (FM) transmission system used, these channels exhibit relatively high noise levels compared with the main audio channel. Companding is therefore utilized for the stereo subchannel and the SAP channel to provide acceptable noise performance. The companding system presently utilized is referred to as the "dbx Companding System" and is described in detail, for example, in an article by Leslie B. Tyler et al, in the IEEE Transactions on Consumer Electronics, November 1984, Volume CE-30, No. 4, pages 633-640 and in an article by C. G. Eilers, in the IEEE Transactions on Consumer Electronics, February 1985, Volume CE-31, No. 1, pages 1-7.

The "dbx Companding System" sets out to improve the attainable signal to noise ratio. Fixed and variable preemphasis are applied to the audio signal before transmission. This is intended to avoid two problems which may occur when fixed preemphasis is used alone. First, audio signals which contain predominantly high frequencies would be boosted excessively causing overmodulation. Second, low level audio signals lacking sufficient high frequency content would not be sufficiently boosted to mask noise.

In the "dbx" system, a bandpass filter and detector arrangement at the transmitting end provide a control signal representative of the high frequency content of the audio signal. The audio signal is passed through a variable preemphasis arrangement responsive to the control signal. When the signal high-frequency content is relatively high, the preemphasis arrangement reduces high frequency gain and conversely, when the high-frequency content is relatively low, the high-frequency gain is increased.

The inverse of these operations, i.e. "expanding", takes place in the receiver so as to restore the signal to its original condition. The present practice for both the stereo difference signal and the SAP signal, as explained in the afore-mentioned articles, is to provide another bandpass filter for deriving a control signal representative of the high-frequency content of the received signal and to pass the signal through a variable deemphasis arrangement responsive to the control signal in an inverse manner to that in the preemphasis arrangement in the transmitting end.

Stereo signals are derived by matrixing the main (L−R) audio channel and the stereo (L−R) subchannel. Good left and right channel separation requires close amplitude and phase matching between the main audio channel after deemphasis and the stereo subchannel, since even a fraction of a dB and a few degrees of phase error can significantly reduce stereo separation. The expander in the stereo subchannel path in the receiver is therefore required to meet stringent requirements in matching that in the transmitting end so as not to degrade stereo separation to any substantial extent. Expanders designed to meet such requirements are somewhat complex and therefore relatively expensive. An example of a companding system of the type referred to is described in a copending Patent Application Ser. No. 06/593,967, entitled "Apparatus for reducing the effect of noise interference in audio companding system", filed in the name of Max Ward Muterspaugh on Mar. 27, 1984, and assigned to RCA Corporation, the Assignee of the present Application.

Stereo reproduction and SAP are generally not required simultaneously. Therefore, typically only one expander is provided, with a switching arrangement to allow it to be selectively included either in the (L−R) stereo subchannel or in the SAP channel signal path.

The present inventor has recognized that, while there is ordinarily no objection to sharing the expander in this manner since it is required anyway in a stereo receiver, there is no need for an elaborate expander when stereo separation is not a concern, as in a monophonic (mono) receiver with an SAP channel.

An aspect of the invention concerns an audio signal processing arrangement included in a television receiver for receiving and demodulating a monophonic audio signal and an SAP signal, the SAP signal having been subjected to variable preemphasis for modifying the magnitude of its relatively high frequency portions without substantially affecting the magnitude of its relatively low frequency portions such as in the aforementioned "dbx" system. The preemphasis is such that the high frequency portions are subject to relatively large magnitude compression when the magnitude of the high frequency portions is relatively large and relatively small magnitude compression when the magnitude of the high frequency portions is relatively small. The audio signal processing arrangement for the SAP signal comprises a first filter for providing an intermediate audio signal representative of the SAP signal and exhibiting a first predetermined amount of deemphasis. A wideband detector, rather than a detector with a bandpass filter at its input as in the "dbx" system, is coupled to the filter for providing a control signal representative of the level of the intermediate audio signal. A controllable gain amplifier has a gain control input coupled to the output of the detector to receive the control signal and a signal input coupled to the output of the filter. A second filter imparts a second predetermined amount of deemphasis to the output signal of the amplifier. This arrangement is far simpler than that of the decoding or expansion portion of the "dbx" system and has been found to provide very acceptable performance for SAP reproduction without the need for the much more complex "dbx" expander as will be explained in greater detail below with reference to the sole FIGURE.

The sole FIGURE shows partly in block form and partly in circuit schematic form a television receiver incorporating a preferred embodiment of the present invention.

Referring to the FIGURE, a signal source 10 applies a signal to input circuitry 12 of a monophonic television receiver comprising tuner, intermediate frequency (IF), and second detector arrangements, all of which are of conventional design. A video signal is supplied by input circuitry 12 to a video signal processing unit 14 including a picture display unit. Input circuitry 12 also supplies a sound IF signal to sound IF, limiter, and FM detector circuitry 16. The FM detector of circuitry 16 supplies a main, monophonic audio signal to an audio signal processing block 18 and supplies an SAP signal to SAP signal processing channel 20. A further example of mono and SAP demodulation is provided in RCA Color Television Basic Service Data, CTC 131 Series, 1984, available from RCA Corporation, Indianapolis, IN.

At the transmitter, the SAP signal is compressed by a variable preemphasis arrangement according to the "dbx Companding System". When the signal high-frequency content is relatively high, the preemphasis arrangement reduces high frequency gain and conversely, when the high-frequency content is relatively low, the high frequency gain is increased. Heretofore, in receivers with SAP channels, the SAP signal has been expanded in a completely complementary manner to the "dbx Companding System" compression. This involved a fixed deemphasis network and a variable gain network responsive to a control signal representative of the amplitude of the high frequency content of the signal. A bandpass filter is required for selecting the high frequency portion of the signal.

For stereo separation, it is essential that the expander in the receiver match the compressor in the transmitter so that the L+R and L−R stereo components can be properly combined (added and subtracted) to produce the L and R audio signals. Close tolerance specifications are therefore required to maintain amplitude and phase errors small in order to avoid degrading stereo separation. However, the present inventor has recognized that for the SAP, although the SAP signal is compressed according to the relatively complex "dbx" system, it can be expanded in a relatively simple manner as will be explained in detail.

The audio output from the circuitry 20 is buffered by a buffer stage 22 whose output is passed through a fixed deemphasis network 24 comprising a series resistor 26 and a shunt capacitor 28 to produce an intermediate audio signal exhibiting deemphasis. Preferably, deemphasis network 24 should have a time constant of about 73 microseconds, which corresponds to a fixed portion of the preemphasis used in the SAP signal transmission.

The intermediate audio output from network 24 is directly applied to a detector 30. Detector 30 preferably exhibits a detection characteristic approximating a root-mean-square (RMS) type of response. The present inventor has found that a detection characteristic approximating an averaging type of response also provides satisfactory performance. The control signal provided by detector 30 is represenatative of the amplitude of the intermediate audio signal provided by deemphasis circuit 24 substantially through the entirety of its frequency range, unlike the relatively narrow band control signal derived in the "dbx" system.

The deemphasized audio output from network 24 is also applied to an amplifier 32 having controllable gain, the gain being responsive to a control signal at a control terminal 34 of amplifier 32. The output signal of detector 30 is filtered by a low-pass filter 36 and the filtered signal is coupled to control terminal 34 as the control signal, in a polarity sense such that an increase in the level of the deemphasized audio output from network 24 tends to cause the gain of amplifier 32 to increase.

The audio output of amplifier 32 is applied to an integrating network 38 through a series resistor 40. Integrating network 38 comprises an inverting amplifier 42 with a feedback network comprising the parallel combination of a resistor 44 and a capacitor 46. Integrating network 38 subjects the audio output of amplifier 32 to a further deemphasis. The output signal of integrating network 38 is applied to further SAP signal processing circuitry 48, including, for example, a loud speaker and driver therefor. The present inventor has found that a deemphasis time constant of approximately 390 microseconds in integrating network 38 causes the output signal supplied to load 48 to provide satisfactory reproduction of an SAP signal having dbx compression in accordance with the present broadcasting multichannel system described above. This also corresponds to a fixed portion of the preemphasis used in the SAP signal transmission. Overall, the present invention provides approximately a 2 to 1 expansion in decibels (dB), i.e. a change in the input level of 1 dB causes a change of 2 dB in the output. This corresponds approximately to the expansion provided by the "dbx" system for the low frequency portion of the audio range only.

As was explained, the phase and amplitude constraints placed on the expander because of stereo cancellation requirements are not applicable to the reception of an SAP signal in a mono TV receiver. Furthermore, the overall frequency response of the SAP signal is more limited than that of the main monophonic audio channel. Consequently, while the present invention is not specifically intended to provide the precise phase and amplitude matching required for stereo separation as proposed in the "dbx" system, it has been found to provide good performance corresponding to the requirements of the SAP channel which is primarily speech for a second language. Satisfactory performance can therefore be provided with a considerable reduction in complexity.

The implementation of the invention in accordance with the FIGURE is illustrative. For example, network 24 could be implemented by the use of an operational amplifier integrator. Furthermore, while the invention is most advantageously used in a monophonic television receiver which provides a SAP audio signal (but not a L−R signal for stereo reproduction) it may also be used in a stereophonic television receiver which has both stereophonic and SAP signal channels to expand the SAP signal so that two complex "dbx" expanders need not be used or to eliminate the switching arrangement for selecting between stereo and SAP expansion. These and similar modifications are contemplated to be within the scope of the invention which is defined by the following claims.

What is claimed is:

1. In a television receiver for receiving a selected channel wherein are provided a first audio program signal and a second audio program (SAP) signal containing a high frequency portion and a low frequency portion, said SAP signal being subjected to variable preemphasis for modifying the magnitude of said high frequency portion of said SAP signal without substantially affecting the magnitude of said low frequency portion of said SAP signal such that said high frequency portion is subject to large magnitude compression when the magnitude of said high frequency portion is large and said high frequency portion is subject to small magnitude compression when the magnitude of said high frequency portion is small, said receiver including a detector arrangement for providing first and second outputs corresponding respectively to said first and second audio program signal and including audio signal processing means coupled to said second output for processing said SAP signal which comprises:

first deemphasis network means having an input coupled to said second output for providing an intermediate audio signal representative of said SAP signal and exhibiting a first predetermined amount of deemphasis;

detector means coupled to receive said intermediate audio signal from said first deemphasis network for providing an output representative of the magnitude of said intermediate audio signal substantially throughout its entire frequency range;

controllable gain amplifier means having a gain control input coupled to said detector means and having a signal input coupled to said first deemphasis network; and filter means for imparting a second predetermined amount of de-emphasis to the output of said amplifier.

2. The audio signal processing means recited in claim 1 wherein said output of said detector means is representative of one of the root mean square and the average level of said intermediate signal.

3. The audio signal processing means recited in claim 1 wherein said filter means comprises further amplifier means and a feedback network coupled between the output and the input of said further amplifier means.

4. The audio signal processing means recited in claim 3 wherein said filter means further comprises impedance means coupled between said input of said further amplifier means and the output of said controllable gain amplifier means.

5. The audio signal processing means recited in claim 4 wherein said first deemphasis network exhibits a time constant in the order of 73 microseconds and said filter means exhibits a time constant in the order of 390 microseconds.

* * * * *